United States Patent [19]
Skramsted et al.

[11] Patent Number: 5,838,434
[45] Date of Patent: Nov. 17, 1998

[54] SEMICONDUCTOR DEVICE LEAD CALIBRATION UNIT

[75] Inventors: David A. Skramsted, Garland; Clyde M. Guest, III, Plano; Dennis M. Botkins, Seagoville, all of Tex.

[73] Assignee: Semiconductor Technologies & Instruments, Inc., Dallas, Tex.

[21] Appl. No.: 777,843

[22] Filed: Dec. 26, 1996

Related U.S. Application Data

[60] Provisional application No. 60/011,587, Dec. 26, 1995.
[51] Int. Cl.$^6$ ........................................ G01J 1/02
[52] U.S. Cl. .......................... 356/243; 382/145; 382/146
[58] Field of Search ............................ 356/243; 382/145, 382/146

[56] References Cited

U.S. PATENT DOCUMENTS

| | | | |
|---|---|---|---|
| 4,847,911 | 7/1989 | Morimoto et al. | 382/145 |
| 5,115,475 | 5/1992 | Lebeau | 382/146 |
| 5,168,217 | 12/1992 | Sakaguchi | 382/146 |
| 5,249,239 | 9/1993 | Kida | 382/145 |
| 5,402,505 | 3/1995 | Roy et al. | 382/145 |
| 5,414,458 | 5/1995 | Harris et al. | 348/126 |
| 5,490,084 | 2/1996 | Okubo et al. | 382/145 |
| 5,563,703 | 10/1996 | Lebeau et al. | 382/146 |

*Primary Examiner*—F. L. Evans
*Assistant Examiner*—Zandra V. Smith
*Attorney, Agent, or Firm*—Akin, Gump, Strauss, Hauer & Feld, L.L.P.

[57] ABSTRACT

The invention is to a calibration unit (11) for use with a moveable scale reference (9) for calibration of semiconductor package outlines, the calibration unit (11) is a monolithic rectangular block which has a plurality of legs (12) formed on and integal with said rectangular block and having spacing independent from the leads on a semiconductor device.

11 Claims, 9 Drawing Sheets

SEMICONDUCTOR DEVICE LEAD CALIBRATION UNIT

This application claims priority under 35 USC § 119(e)(1) of provisional number 60/011,587 filed Dec. 26, 1995.

FIELD OF THE INVENTION

This invention relates to semiconductor devices, and more particularly to a lead calibration unit used in conjunction with machine vision image system used for inspecting for coplanarity of leads on surface mount devices.

CROSS REFERENCES

U.S. Pat. No. 5,414,458 issued May 9, 1995, entitled SEMICONDUCTOR DEVICE LEAD INSPECTION SYSTEM.

U.S. Pat. No. 5,402,505 issued Mar. 28, 1995, entitled SEMICONDUCTOR LEAD INSPECTION SYSTEM.

BACKGROUND OF THE INVENTION

In testing and mounting semiconductor devices, it is necessary that the leads of the device be correctly positioned and the ends of the leads lie in a common plane. This is particularly true for surface-mount devices. The leads of the semiconductor device may be bent side ways, out, in or down moving the end of the pin from a plane common with the ends of the other pins. In some instances, one or more pins may have a greater height than the others.

Existing planarity inspection equipment requires that a sample of the device to be inspected be obtained for calibrating the inspection system. If there is variation from one device to any other device, this may affect the inspection process. Existing planarity inspection equipment is either not cost-effective or performs the inspection "off-line" as in a quality control operation. The hardware required for off-line inspection is expensive, however, if the inspection is done manually, lead by lead, making 100% inspection time consuming as well as cost prohibitive.

Automatic equipment which can be used for on-line inspection is actually stand-alone equipment integrated with the other processing equipment.

In order to inspect for coplanarity of the leads of a surface mount device using machine vision, the leads must be located, and the machine vision image has to be converted to scale units such as millimeters or mils using a scale factor. The data has to be converted from multiple two dimension coordinate frames to a three dimensional coordinate frame using a plane for reference. Present systems using the above method for determining planarity have to be calibrated prior to each series of devices to be tested, and pixel jitter or motion, after calibration, is not detected during capture of the picture and may cause errors.

A type of calibration unit has been used, where the calibration unit was made to the exact dimension of a surface mount device (SMD) to be measured. These units were made to the exact dimension and lead count of the SMD. These units are expensive to manufacture and are easily damaged since the lead widths are made to actual dimension.

SUMMARY OF THE INVENTION

The invention is to a calibration unit for use with a moveable scale reference for calibration of semiconductor package outlines. The calibration unit is a monolithic rectangular block which has a plurality of legs formed on and integral with said rectangular block, spaced apart on said block, and having spacing independent of any specific semiconductor device.

The technical advance represented by the invention, as well as the objects thereof, will become apparent from the following description of a preferred embodiment of the invention when considered in conjunction with the accompanying drawings, and the novel features set forth in the appended claims.

DESCRIPTION OF A PREFERRED EMBODIMENT

Figure 1:
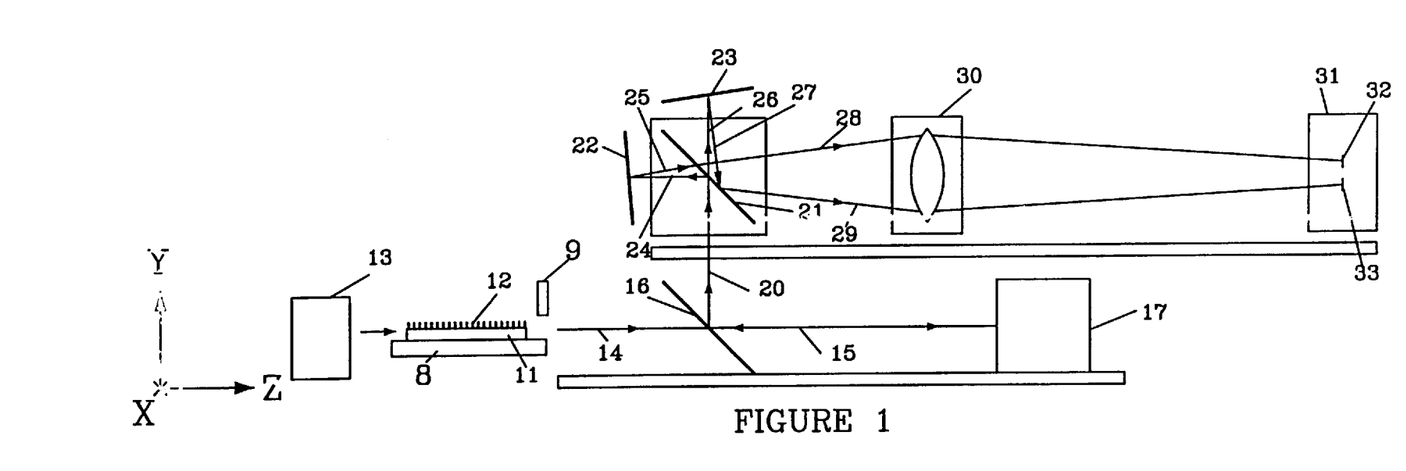
FIG. 1 illustrates a folded optical path and the related components in an inspection system which may be used with a calibration unit of the present invention.

The calibration unit of the invention may be used with the system illustrated in FIG. 1. FIG. 1 shows the optical path and components for the component lead inspection system. A semiconductor device 11 having a plurality of leads 12 is mounted on a rotatable platform or base 8 in front of illumination system 13. The illuminated image is viewed by camera 31 along path 14, through mirror assembly 17, is reflected back along path 15 to mirror 16 and reflected at a 90 degree angle along path 20 to mirror/beam splitter 21. The camera views an image of the semiconductor device 11 and the real time reference 9.

When the image impinges on mirror/beam splitter 21, the image is reflected via path 24 to reflector 22, and back along path 25, through mirror/beam splitter 21 along path 28 to lens assembly 30 to camera 31.

The image passes through mirror/beam splitter 21 along path 26 to reflector 23, back along path 27 to mirror/beam splitter 21 and is reflected along path 29 to lens assembly 30 where it is focused on camera 31. It should be noted that during the splitting of the image at mirror/beam splitter 21, the two images may be separated vertically such that image 32 and image 33 are vertically and horizontally spaced and horizontally shifted from each other at camera 31.

Camera 31 is, for example, a full frame high resolution type camera such as the Kodak "MegaPlus" camera having improved reliability with the shutter removed. There is no need for an electro-mechanical shutter since the illumination source 13 is strobed at a rate synchronized to the camera vertical blanking signal, presenting a continuous image of the device 11 and real-time reference 9.

Figure 2:
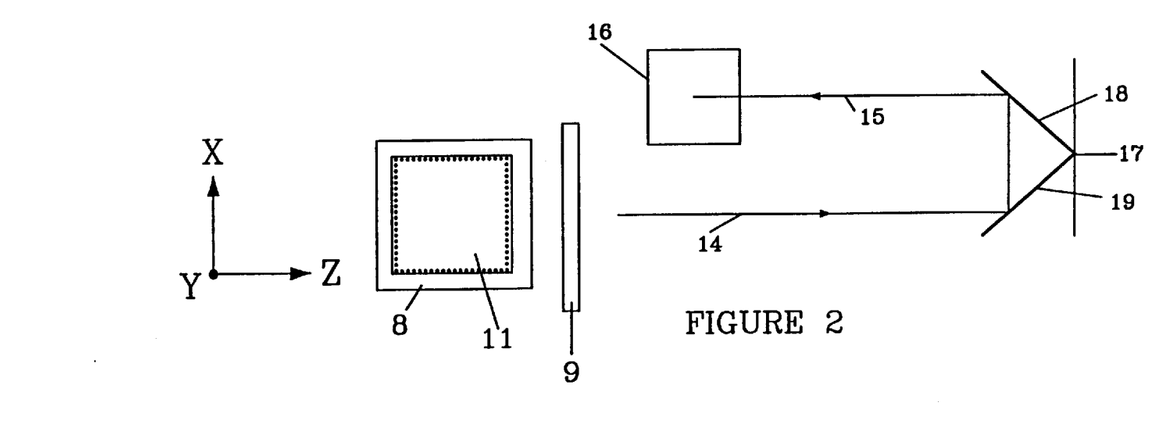
FIG. 2 is a top view of part of the optical path.

FIG. 2 is a top view of the optical path represented by paths 14 and 15, and mirror assembly 17. Device 11 is in front of illumination source 13. An image of device 11 and the real-time reference is directed along path 14 to mirror assembly 17. Mirror assembly 17 includes two mirrors 18 and 19 positioned at a 90 degree angle with each other.

The image impinges on mirror 19 is reflected to mirror 18, and in turn is reflected along path 15 to mirror 16. Mirror 16 is positioned at a 45 degree angle from the horizontal plane, as illustrated in FIG. 1.

Figure 3:
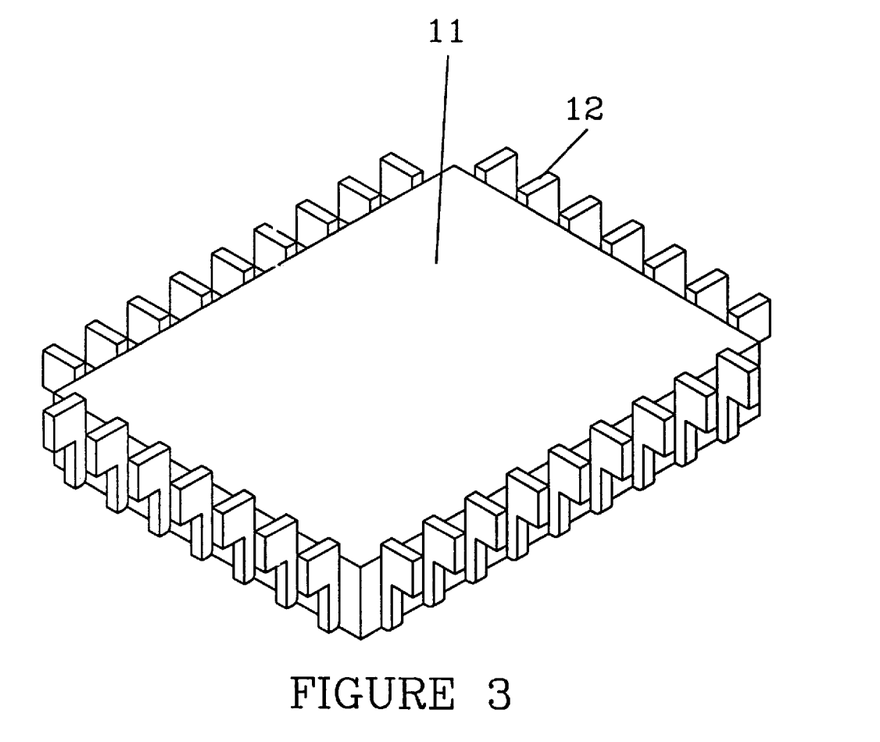
FIG. 3 shows a first embodiment of a calibration unit of the present invention.

FIG. 3 shows the calibration unit 11. Calibration unit 11 is a monolithic metal block with a number of legs 12 machined into the perimeter of the unit. Legs 12 extend outward from the calibration sides which represent the sides of a semiconductor device. The sides are generally represented by the area within dimension "a", FIG. 4b. The monolithic block has first and second regions on the sides of the block, said first region (dimension b, FIG. 4b) larger than said second region (dimension "a"), said first region representing the outside dimension of pins (dimension b, FIG. 4b) on a semiconductor device.

The legs are generally rectangular projections extending upward from a surface of the monolithic metal block. The calibration unit 11 resembles the leads and body of an actual surface mount device when viewed from the side or top using shadow illumination. When used in conjunction with a movable scale factor reference or real time referenced device 9 (FIG. 5), the calibration unit can be used to calibrate a wide range of package footprints. The scale factor is determined by the movable real time reference 9, which is always placed a known distance from to calibration unit 11, or a semiconductor device being measured. A scale factor correction is calculated by software so that the calibration unit 11 dimension measurements by the camera match the known dimensions of the calibration unit. The scale factor is determine by dividing the known dimensions of the features on the real-time reference (in mils) by the dimensions of the features measured by the camera (in pixels. When a larger or smaller package is measured, the movable scale factor reference is moved in or out so that it is a constant distance K (FIG. 8) in front of the package. The uncorrected scale factor correction determined by the calibration unit 11 is then applied to the scale factor determined from the movable reference. This scale factor, when applied to the calibration unit, gives dimensions which do not match the actual dimensions of the calibrations unit. This is due to the difference in magnification between the reference and the calibration unit since the real-time reference is 50 mils closer to the camera. It is also due to differences in perspective. The real-time reference is higher than the calibration unit.

The ratio between the known dimensions of the calibration unit and the measured dimensions (using the real-time reference scale factor) is the scale correction factor. Once determined, the scale correction factor is a constant for all packages which can be used with the calibration unit.

When viewed from the sides or the top (FIGS. 4a, 4b and 4c), the calibration unit presents a silhouette which closely resembles a surface mount device. From these perspectives, all lead measurements of importance for quality assurance in surface mount devices can be measured similarly on the calibration unit 11.

The measurements of importance are: (1) coplanarity, which is the difference in height of leads with respect to a plane; (2) bent lead, the horizontal true position of a lead with respect to a reference datum; (3) lead pitch, horizontal spacing of leads; (4) stand-off, height of lead above the package body; (5) tweeze, differences in lengths of leads; and (6) cross-package distance, the lead tip to lead tip distance.

Figure 4A:
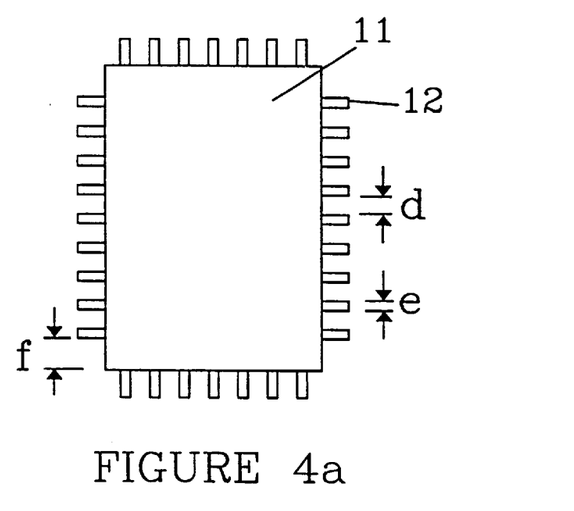
FIGS. 4a, 4b and 4c are top, side and end views, respectively, of a calibration unit.
Figure 4B:
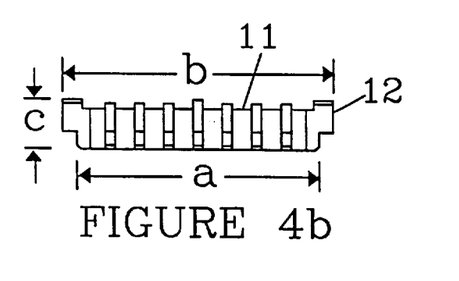
Figure 4C:
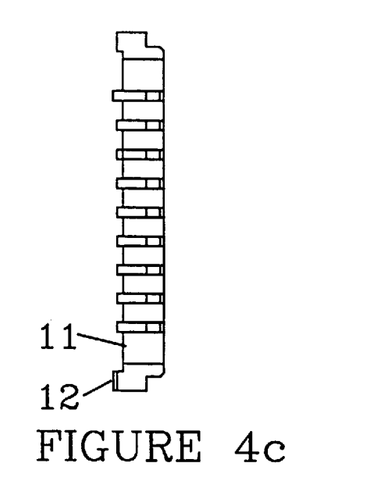

The size of a calibration unit is determined as follows. References to dimensions a, b, c, d, e and f are those dimensions as shown in FIGS. 4a and 4b. Dimension "a" must be small enough to fit within the dimensions of mounting plate 8, FIG. 6. Dimension "a" should be approximately 50 mils smaller than dimension "b". Dimension "b" must be matched to the lead tip-to-tip distance of packages used with the calibration unit. Each calibration unit may be used with a set of packages having lead tip-to-tip distances which differ by up to 100 mils. Dimension "b" should be in the middle of this range.

Dimension "c" should match the actual package dimension from lead tip to top surface of the package within a tolerance of +/−20%.

Dimension "d" (the spacing of the leads) should allow a minimum of 7 leads to be machined into each side of the calibration unit.

Dimension "e" (lead width) is a minimum of 25 mils to ensure durability and stability of the lead deatures. Dimension "e" should be approximately ⅓ of dimension "d".

Dimension "f" (distance from last lead on the side to the edge of the calibration unit) should be approximately the same as dimension "d".

The calibration unit should have a minimum of 7 lead features on each side. This allows 4 lead features to be visible in each portion of the split image descired with reference to FIG. 2. The horizontal spacing between the lead featues is use to calibrate the horizontal dimension of the camera. The vertical height difference between the lead features is used to calibrate the vertical dimension of the camera. The number of lead features on the calibration unit is not related to the number of leads on an actual device.

The lead features should have a minumum of 25 mils width to provide durability. The relationship between the lead width on the calibration unit and lead width on actual devices in not important. The length of the lead features satisfy the requirement imposed by dimenstion "a" and "b". Lead length=$(b-a)/2$.

Using one calibration unit to calibrate devices of different sizes is possible. In this instance, the following constraints are placed on the calibration unit. The "b" dimension must be within +/−50 mils of the lead tip-to-tip distance of the actual device to be inspected. The "c" dimension must be within +/−20% of the actual height of the device to be inspected. These constraints allows the majority of QFP packages to be calibrated using a set of six calibrations units designed for the following six package families: 32×32 mm QFP packages, 28×28 mm QFP packages, 14×20 mm QFP packages. 14×14 mm thin QFP packages. 10×10 mm thin QFP packages, NS 7×7 mm thin QFP packages. The tip-to-tip distances of the devices within each family of packages typically varies by 40 mils which is within the +/−50 mils constraint.

The key to the calibration process is the movable real-time reference shown in FIG. 8 below. This reference is always placed 50 mils closer to the camera than the leads of the device being inspected. Moving the real-time reference to reflect changes in the package dimensions compensates for the change in magnification due to the device being closer or farther away form the camera.

Calibration unit 11 is inexpensive to manufacture and the number of lead features are kept to a minimum. The lead features are wider than leads on an actual QFP surface mount device. As long as the distance between the leads and the height of the leads is known to an accuracy of 0.1 mils, accurate calibration can be accomplished.

As an example, a calibration unit with a total length and width of 1230 mils was used in calibration. Using the visions system of FIG. 1, the camera calibration scale factors were adjusted as illustrated in FIG. 8a to achieve lead true position measurements with an accuracy of 0.25 mil on the calibration unit. Packages ranging from 1205 mils to 1256 mils were then measured using the scale factor correction calculated from the calibration unit. The scale factor reference 9 was moved in by 12.5 mils for the 1205 mil package and out by 13 mils for the 1256 mil package. The lead accuracy of the true position measurements for all leads on all packages was 0.25 mil or better.

Figure 5:
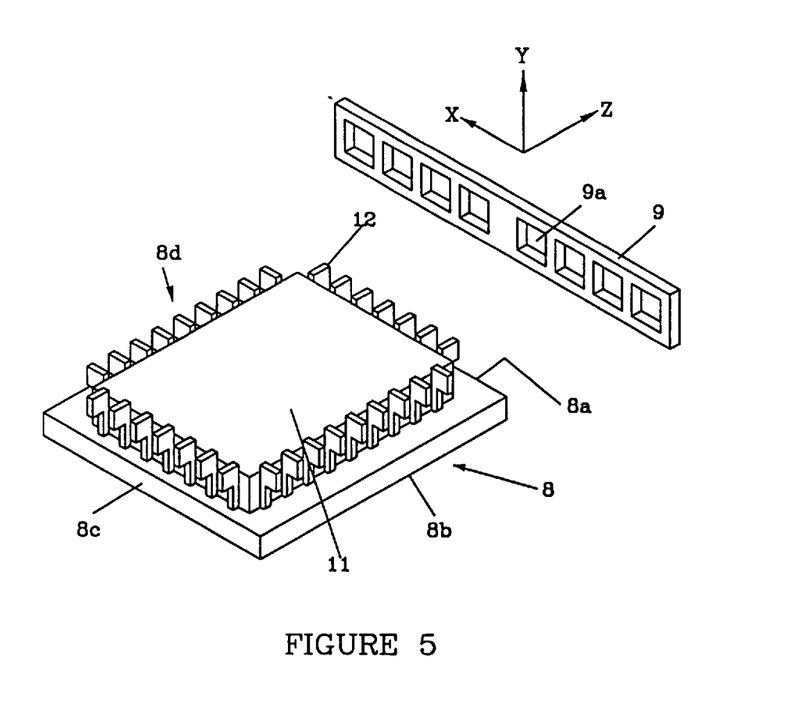
FIG. 5 shows the real-time reference, a mounting plate and a calibration unit mounted thereon.

FIG. 5 shows a mounting plate 8, calibration unit 11, and a real time reference plate 9 with apertures 9a. In determining the planarity of leads 12 on each of the four sides of device 11, plate 8 has to be rotated to present each of the leads on the four sides of device 11. Plate 8 is rotatable and each of the four sides 8a, 8b, 8c and 8d are rotated toward the camera image path to place one of the device 11 sides toward the camera.

Figure 6:
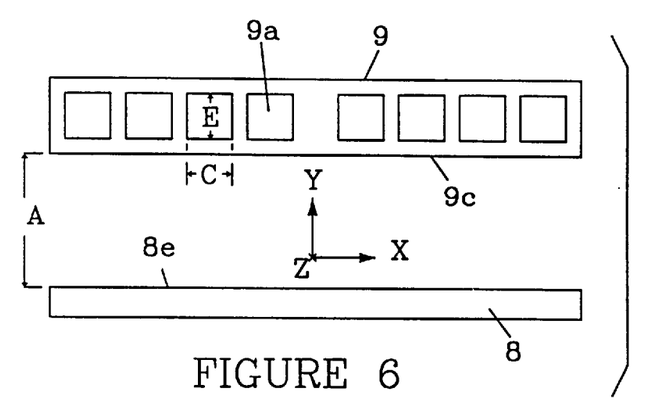
FIG. 6 shows the real-time reference and mounting plate as viewed from the image system.

FIG. 6 illustrates the mounting plate 8 and real-time reference as viewed from the camera. In order to compensate for any slight variation caused by thermal expansion or movement of the optical components, the distance from the top of plate 8 to the bottom of the real time reference, distance A, is measured by the camera for each of the four sides of mounting plate 8. Each of the distances $A_1$, $A_2$, $A_3$ and $A_4$ is stored during a test to calibrate the image system using the real time reference 9. The Distance A is measure for each of the four sides of plate 8, and the image system is calibrated to define the relationship between pixels and mils. The dimensions, C and E, of apertures 9a in real-time reference 9 are known, therefore, the number of pixels for the apertures can be related to linear measurement in mils. The top edge of the plate 8 is determined by the black-to-white transitions from the body of the plate to the space above the plate. The apertures 9a are also located and measured by white-to-black transitions from the aperture to the aperture frame.

Figure 7:
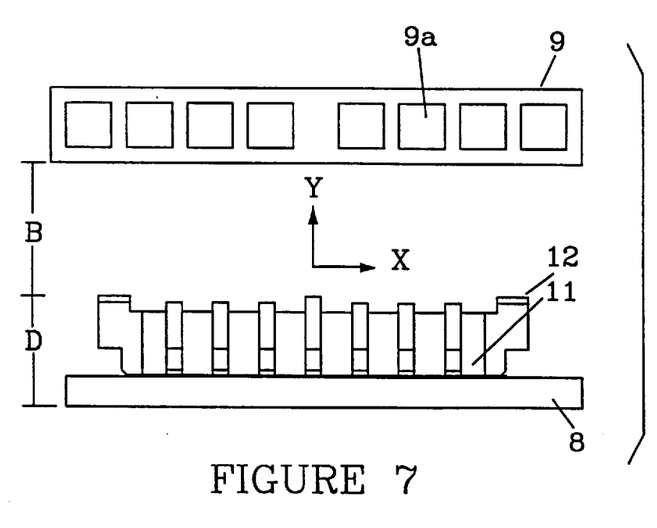
FIG. 7 shows the real-time reference, mounting plate and a calibration unit.

FIG. 7 shows mounting plate 8 with a calibration unit 11 mounted thereon. The distance B from the top of the lead 12 to the bottom of the real-time reference is measured. Then the distance of the top of a lead 12 from the top of plate 8 can be calculated since the measurements $D_n = A_n - B_n$, where n is a number from 1 to 4, represents the side of the semiconductor device for which the lead heights are being measures. $A_n$, as mentioned above, is measured for each side of plate 8, and only needs to be measured once during the inspection operation for a series of devices.

Figure 8:
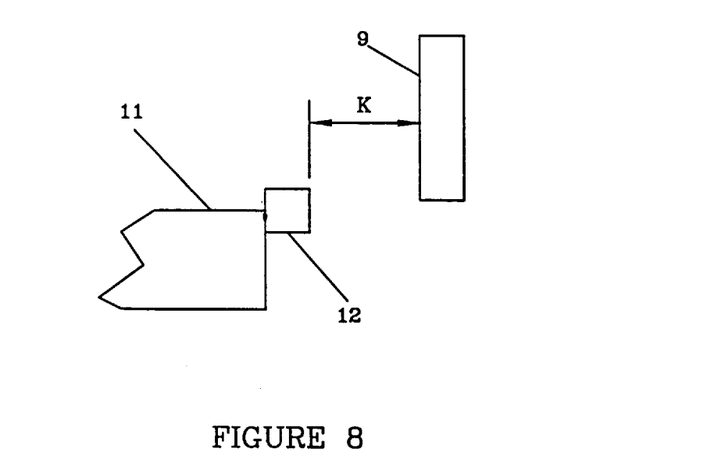
FIG. 8 illustrates the constant distance from the calibration unit and the movable reference.
Figure 8A:
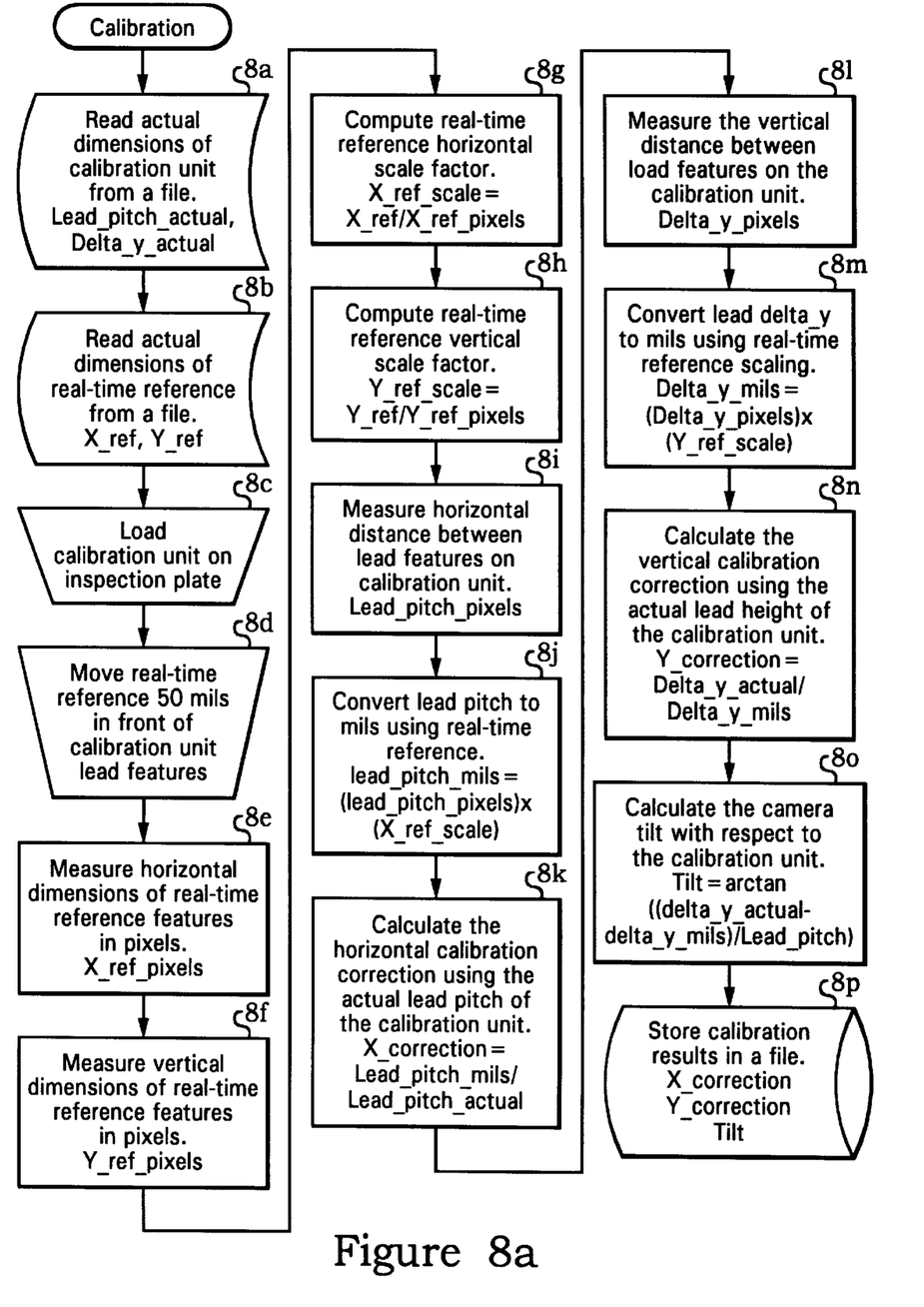
FIG. 8a is a process flow diagram showing calibration of an inspection system.

FIG. 8 shows the horizontal distance between the real time reference 9 and the calibration unit 11. The distance K between the real time reference 9 and the edge of a lead 12 on the calibration unit 12 remains constant at all times.

The system operates as follows. The real-time reference is positioned so that it is 50 mils closer to the camera than the leads on the calibration unit when it is loaded on to plate 8 (during this first step, plate is emptu). The image system scans the real-time reference 9 (FIG. 5) and locates the features 9a (FIG. 5). The features are located by searching for white to black transistions in the image. Once these features are located, the spacing etween the features is used to calculated the conversion scaling from camera dimensions (pixels) to object (real world) dimensions (mils or inches). This is possible becasue the actual dimensions of the real-time reference have been previously measured by a manual inspection system which has been certified as accurate. The actual dimensions of the reference are stored in a file which can be read by the system. The bottom edge of the real time reference is then located at several positions across the entire field of view. A straight line approximation to these points is calculated by using least-mean-squares linear regression. This straight line will be the reference point for measuring the height of each lead. The top edge of the plate 8 is measured at several positions across the entire field of view. A straight line approximation to these points is caclulated by using least-mean-squares linear regression. This is repeated on each side of plate 8 giving a total of 4 lines. The distance and angle between the bottom edge of the real time reference and each top edge of plate 8 is calculated and stored.

Next, the calibration unit is loaded on plate 8 and the lead feature positions are measured. The top of the leads are measured with respect to each other. Plate 8 is rotated so that the lead features can be located on each side of the calibration unit. Using the distance form the real-time reference to plate 8 ($A_1$, $A_2$, $A_3$ and $A_4$), the distance from the lead tips to plate is calculated. After this calculateion, the position of all the lead tips in a three-dimensional coordinate system is known with plate 8 forming the x—y plane of the coordinate system. The distance between the lead features in the horizontal and vertical directions is converted from camera units (pixels) to mils using the scaling factor calculated from the real time reference. These measured distances are compared with the actual distances between the lead features on the calibration unit. This information is used to calculated a ratio etween the actual distances and the measured distances. This ratio is used as a correction to the camera scaling (pixel to mil scaling). The height difference between the leads on the calibration unit is used to calculate a correction to the angle of plate 8. The calculation of the correction to the camera scaling and plate 8 angle concludes the calibaration process.

After calibration, a semiconductor device (not illustrated) is mounted on plate 8 and the image system scans for leads, and locates them with respect to the real time reference. The system locates the edge of each lead by finding points of transition from white to black, where black is the lead image. All leads are located. By knowing the relationship between pixels and mils, the exact location of each lead, for each of the four sides of the semiconductor device, is determined.

The distance from the lead tip to the real-time reference is measured for all leads on all four sides of the semiconductor device. Using the distance from the real-time reference to plate 8 ($A_1$, $A_2$, $A_3$ and $A_4$), the distance from the lead tips to plate 8 is calculated. After this calculation, the position of all the lead tips in a three-dimensional coordinate system is known with plate 8 forming the x—y plane of the coordinate system.

In testing semiconductors in an automated system, each device has the same orientation when it is placed on plate 8. Therefore, when data is reviewed for each device, any lack of coplanarity for any lead can be related to the exact side of the device corresponding to its placement on plate 8.

Figure 8B:
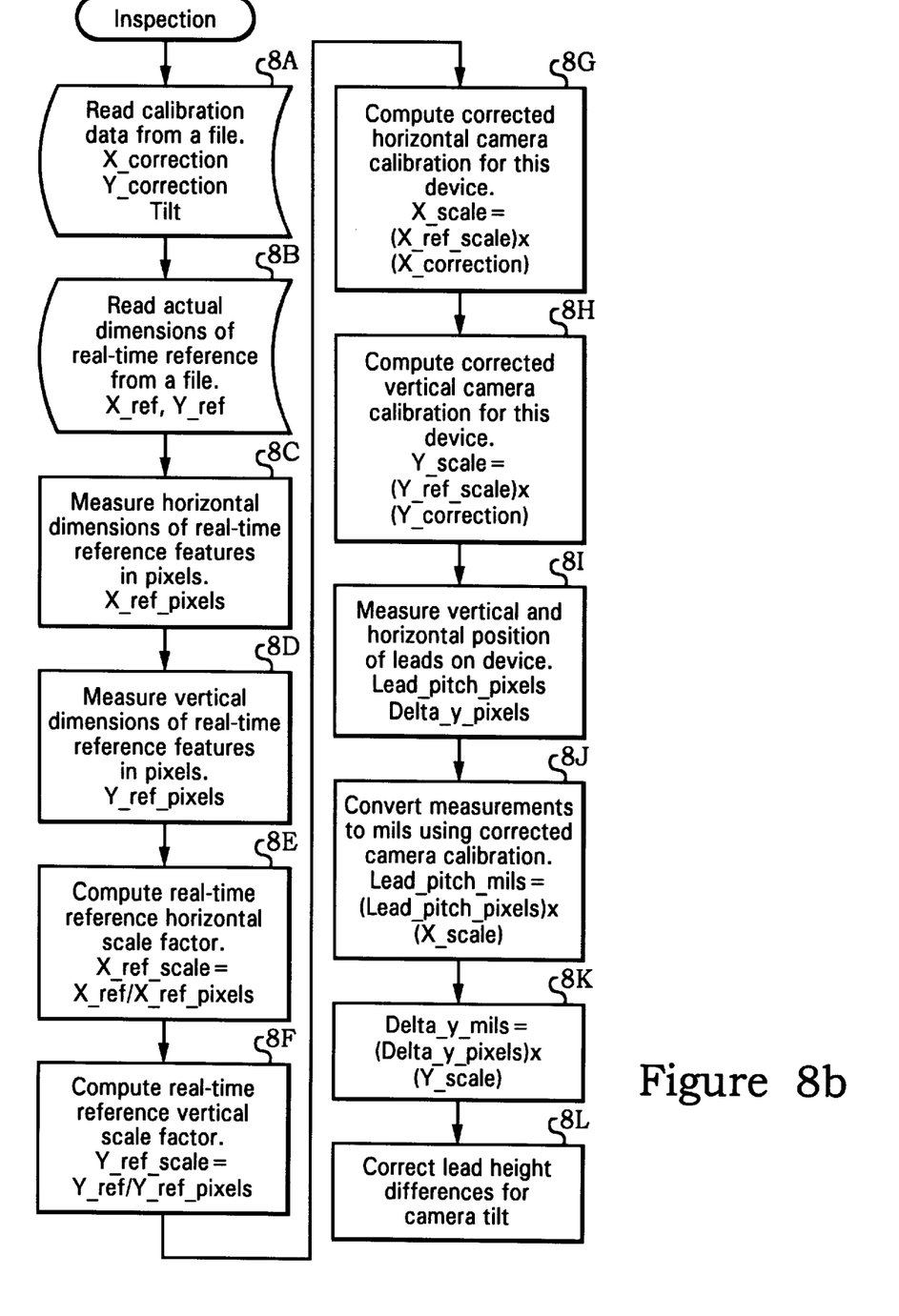
FIG. 8b is a process flow diagram showing the steps in inspecting a device.

The key to the calibration process is the movable real-time reference shown in FIG. 8. This reference is always 50 mils closer than the leads of the device being inspected. Moving the real-time reference to reflect changes in the package dimensions compensates for the change in magnification due to the device being closer or farther away from the camera. FIG. 8a shows the steps used in the calibration process. FIG. 8b shows the process steps used in Inspecting using the calibration data. The outputs of the calibration process are the X_ correction, Y_correction and the Tilt, where: X_ correction compensates the horizontal camera calibration for differences in magnification and perspective between the real-time reference and the lead features on the calibration unit; Y_correction compensates the vertical camera calibration for differences in magnification and perspective between the real-time reference and the lead features on the calibration unit; and Tilt compensates for the tilt of the camera with respect to the calibration unit. This compensation must be calculated for each side of the calibration unit.

Referring to FIG. 8a, the calibration steps are as follows:
8a. Read actual dimension of calibration unit from a file;
8b. Read actual dimensions of real-time reference from file;
8c. Load calibration unit on inspection plate;
8d. Move real-time reference 50 mils in front of calibration unit lead features;
8e. Measure horizontal dimensions of real-time references in pixels;
8f. Measure vertical dimensions of real-time references in pixels;
8g. Compute real-time reference horizontal scale factor;
8h. Compute real-time reference vertical scale factor;
8i. Measure horizontal distance between lead features on cal unit;
8j. Convert lead pitch to mils using real-time reference scaling;
8k. Calculate horizontal calibration correction using the actual lead pitch of the calibration unit;
8l. Measure the vertical distance between lead features (delta_y) on the calibration unit;
8m Convert the delt_y to mils using real-time reference scaling;
8n. Calculate the vertical calibration correction using the actual lead height of the calibration unit;
8o. Calibrate the camera tilt with respect to the calibration unit; and
8p. Store calibration results in a file.

Once the unit has been calibrated, then inspection of devices is as follows:
8A. Read calibration data from a file;
8B. Read actual dimensions of real-time reference from a file;
8C. Measure horizontal dimensions of real-time reference features in pixels;
8D. Measure vertical dimensions or real-time reference features in pixels;
8E. Compute real-time reference horizontal scale factor;
8F. Compute real-time reference vertical scale factor;
8G. Compute corrected horizontal camera calibration for device under test;
8H. Compute corrected vertical camera calibration for device under test;
8I. Measure vertical and horizontal position of leads on device;
8J. Convert measurements to mils using corrected camera calibration, (Lead_pitch_mills)=(Lead_pitch_pixels)×(x_scale);
8K. Set Delta _y_mils=(Delta _y_pixels)×(y_scale); and
8L. Correct lead height differences for camera tilt.

Figure 9:
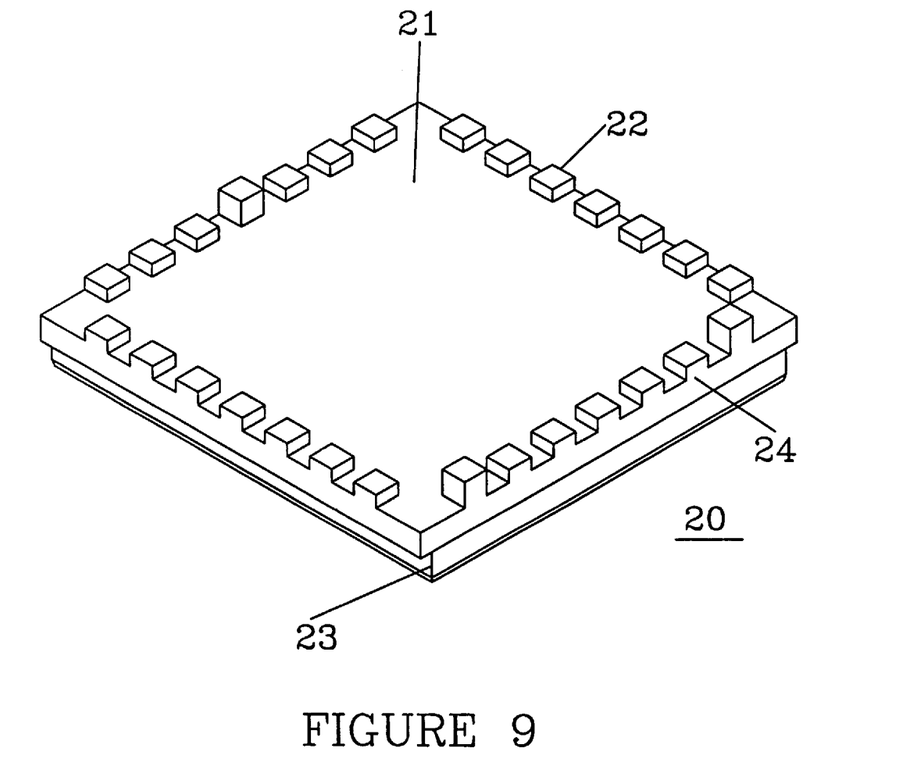
FIG. 9 illustrates a second embodiment of a calibration unit.
Figure 10A:
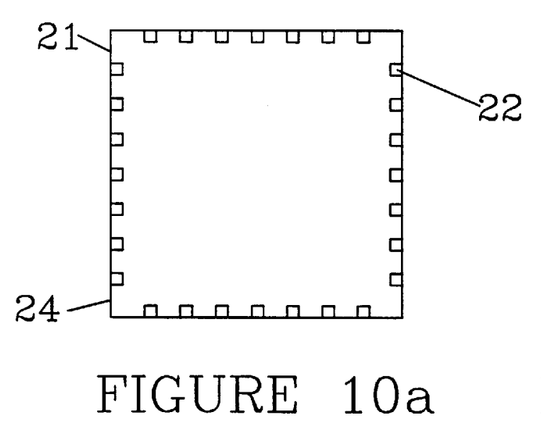
FIGS. 10a, 10b and 10c are top, side and end views, respectively, of a calibration unit.
Figure 10B:
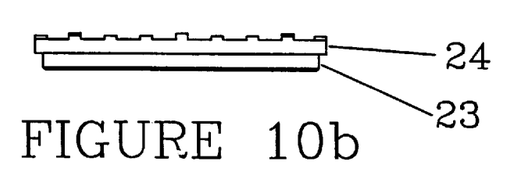
Figure 10C:
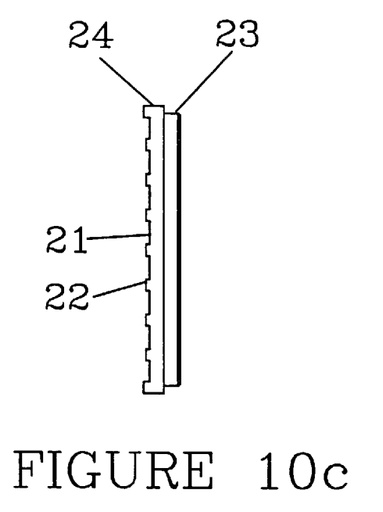

FIG. 9 illustrates a second embodiment of a calibration unit. Calibration unit 20 is a single block 21 of material with simulated leads 22 spaced around the edge of block 21. Leads 22 have spacing and height that correspond to that of typical semiconductor devices, and are utilized with the vision system to calibrate a lead measurement system, and by scaling may be scaled to any particular device. Unit 21 has a recessed portion 23 so that the edges 24 extend outward from block 21 as would leads on an actual device. FIGS. 10a, 10b and 10c show the top, and sides of calibration unit 20.

What is claimed:

1. A calibration unit for use with a moveable scale reference for calibration of semiconductor package outlines, comprising:
a monolithic rectangular block; and
a plurality of legs formed on and integral with said block, said legs being spaced apart on said block, and said legs are oversized when compared with actual leads on a semiconductor device to add strength and to prevent bending of said legs.

2. The calibration unit according to claim 1, wherein said legs are rectangular projections extending upward from a surface of said block.

3. The calibration unit according to claim 1, wherein said block has first and second regions on the sides of said block, said first region larger than said second region, said first region representing the outside dimension of pins on a semiconductor device.

4. The calibration unit according to claim 1, wherein said legs include portions extending upward and outward from a surface of said block.

5. The calibration unit according to claim 4, wherein said outward extending portions extend from surface edges of said calibration unit.

6. A calibration unit for use with a moveable scale reference for calibration of semiconductor package outlines, comprising:
a monolithic rectangular block; and
a plurality of legs formed on and integral with said block, said legs being spaced apart on a surface of said block, and said legs are oversized when compared with actual leads on a semiconductor device to add strength and to prevent bending of said legs.

7. The calibration unit according to claim 6, wherein said legs are rectangular projections extending upward from a surface of said block.

8. The calibration unit according to claim 6, wherein said block has first and second regions on the sides of said block, said first region larger than said second region, said first region representing the outside dimension of pins on a semiconductor device.

9. The calibration unit according to claim 6, wherein said legs include portions extending outward from surface edges of said calibration unit.

10. A calibration unit for use with a moveable scale reference for calibration of semiconductor package outlines, comprising:
a monolithic rectangular block, said block including first and second regions on the sides of said block, said first region larger than said second region, said first region representing the outside dimension of pins on a semiconductor device and said second region representing the dimension between opposed sides of said block; and
a plurality of legs formed on and integral with said block and spaced apart on said block on said opposed sides, respectively, said plurality of legs on each of said opposed sides extending between said first region and said second region, respectively.

11. A calibration unit for use with a moveable scale reference for calibration of semiconductor package outlines, comprising:

a monolithic rectangular block, said block including first and second regions on the sides of said block, said first region larger than said second region, said first region representing the outside dimension of pins on a semiconductor device and said second region representing the dimension between opposed sides of said block; and a plurality of legs formed on and integral with said block, and spaced apart on a surface of said block on said opposed sides, respectively, said plurality of legs on each of said opposed sides extending between said first region and said second region, respectively.

* * * * *